US005886660A

United States Patent [19]

Loewenstein

[11] Patent Number: 5,886,660

[45] Date of Patent: Mar. 23, 1999

[54] TIME-TO-DIGITAL CONVERTER USING TIME STAMP EXTRAPOLATION

[75] Inventor: Edward B. Loewenstein, Austin, Tex.

[73] Assignee: National Instruments Corporation, Austin, Tex.

[21] Appl. No.: 959,199

[22] Filed: Oct. 28, 1997

[51] Int. Cl.$^{6}$ ...................................................... H03M 1/50

[52] U.S. Cl. ............................................................ 341/166

[58] Field of Search .................................... 341/144, 155, 341/167, 166, 157

[56] References Cited

U.S. PATENT DOCUMENTS

| | | | |
|---|---|---|---|
| 3,573,797 | 4/1971 | Kopelson | 341/144 |
| 4,730,314 | 3/1988 | Noguchi . | |
| 5,191,336 | 3/1993 | Stephenson . | |

OTHER PUBLICATIONS

Lugol et al., "A One Nanosecond Resolution Time–to–Digital Converter," IEEE Transactions on Nuclear Science, vol. NS–30, No. 1, Feb. 1983, pp. 297–300.

Dhawan et al., "The Measurement With a Multiphase Clock," IEEE Transactions on Nuclear Science, vol. NS–30, No. 1, Feb. 1993, pp. 293–296.

Kostamovaara et al., "Time–to–Digital Converter With an Analog Interpolation Circuit," Rev. Sci. Instrum. 57 (11) , Nov. 1986, pp. 2880–2885.

*Primary Examiner*—Brian Young
*Attorney, Agent, or Firm*—Conley, Rose & Tayon; Jeffrey C. Hood; Darryl J. Adams

[57] ABSTRACT

A time-to-digital converter starts a ramp signal generator when a trigger signal is received. The ramp signal generator outputs a signal with a substantially constant slope. The output of the ramp signal generator is sampled at two or more reference points. The sampled amplitudes and times at which the samples are taken are stored. An extrapolater calculates the time at which the ramp signal started from the stored amplitudes and times of the samples. Alternatively, the output of the ramp signal generator may be sampled at a periodic rate in which case only the sampled amplitudes and the time of the first sample are stored. In this manner, the time of the trigger signal can be accurately detected without the need for multiple reference signals.

25 Claims, 4 Drawing Sheets

TIME-TO-DIGITAL CONVERTER USING TIME STAMP EXTRAPOLATION

BACKGROUND OF THE INVENTION

1. Field of the Invention

The present invention relates to time measurement devices and, more particularly, to time-to-digital converters.

2. Description of the Relevant Art

Time-to-digital converters (TDC) are used in various applications to measure the time at which an event occurs. The occurrence of an event is detected via a trigger signal input. The TDC detects when the trigger signal, or trigger event, occurs relative to a reference clock signal. Although the reference clock signal may be very precise, it is often necessary to resolve the occurrence of the trigger signal with more precision than the period of the reference clock. Therefore, it is necessary to determine at what point within a clock period an event occurs.

Many techniques exist for measuring the time delay from a trigger event to a reference clock signal. For example, dual slope devices use "expanded time" to measure time delays. In dual slope devices, the arrival of the trigger event initiates the charging of an integration capacitor. The charging stops on the subsequent edge of a reference clock signal. The voltage of the capacitor is thus a measure of the time delay between the trigger event and the reference clock. The capacitor is then discharged at a rate slower than the charge rate, and the discharge time is measured. The discharge time is measured by counting the number of reference clock pulses that occur before the capacitor is fully discharged. The slower discharge time of the capacitor provides a convenient way to accurately measure the charge time, or time delay, using a slower clock rate. Dual slope devices are problematic because they require relatively long times to resolve the time delay. Further, inaccuracies in the charge and discharge currents and capacitive values may effect the accuracy of the time measurement.

FIG. 1 illustrates another embodiment of a time-to-digital converter. This device is referred to as a quadrature TDC. The quadrature TDC includes a quadrature hybrid, a synchronizer, two track-and-hold circuits, two analog-to-digital converters (ADC), and an encoding circuit. The quadrature hybrid outputs two continuous signals, called quadrature signals, that are 90 degrees out-of-phase from each other. The quadrature signals are synchronized with the reference clock. The quadrature TDC determines the time delay relative to the reference clock by measuring the amplitude of the outputs of the quadrature hybrid. The amplitude of the quadrature signals indicate the time at which a trigger event occurred. The quadrature signals must be continuous signals for the quadrature TDC to operate correctly. For example, the quadrature signals may be sinusoids or trapezoidal. Because the quadrature signals are continuous, it is necessary to detect the amplitude of multiple signals. Continuous signals reach the same amplitude at least two times each cycle. Therefore, the quadrature hybrid outputs two signals that are 90 degrees out-of-phase. By measuring the amplitude of both quadrature signals, it is possible to accurately determine at which point the trigger event occurred. Unfortunately, the quadrature TDC requires the generation of multiple clock signals and requires multiple track-and-hold circuits and multiple analog-to-digital converters. Quadrature TDC's are discussed in more detail in U.S. Pat. No. 5,191,336 to Paul Stephenson entitled "Digital Time Interpolation System."

What is desired is a TDC that accurately measures beyond the resolution of a reference clock without the need for multiple reference signals. Additionally, a TDC that compensates for inaccuracies in charge and discharge currents is desired.

SUMMARY OF THE INVENTION

The present invention contemplates a ramp signal generator that starts a ramp signal on the occurrence of a trigger signal. The amplitude of the ramp signal starts at a known voltage and increases at a linear rate. The amplitude of the ramp signal is sampled at the beginning of the next reference clock cycle. The amplitude of the ramp signal is again sampled at the beginning of the subsequent clock cycle. From the known initial amplitude and the amplitudes at the beginning of the subsequent clock cycles, the time at which the trigger signal occurred can be extrapolated. The ramp signal is disabled after the time delay is measured and restarted on the occurrence of the next trigger signal. The present invention advantageously measures the time at which an event occurs using one ramp signal and one ADC. The present invention also compensates for inaccuracies in the ramp voltage rate.

Broadly speaking, the present invention contemplates a time-to-digital converter including a ramp signal generator, a sampling device, and an extrapolator. The ramp signal generator starts a ramp signal when a trigger signal is received. The sampling device is coupled to the ramp signal generator and samples an amplitude of the ramp signal at two or more reference points. The extrapolator determines a time at which the ramp signal was started based on the two or more amplitude samples of the ramp signal.

The present invention further contemplates a method of measuring a time that a trigger signal is received comprising the steps of: starting a ramp signal on receipt of the trigger signal; sampling an amplitude of the ramp signal at two or more reference points; and extrapolating a time at which the ramp signal was started from the sampled amplitudes of the ramp signal at the two or more reference points.

BRIEF DESCRIPTION OF THE DRAWINGS

A better understanding of the present invention can be obtained when the following detailed description of the preferred embodiment is considered in conjunction with the following drawings, in which.

DETAILED DESCRIPTION OF THE DRAWINGS

Figure 1:
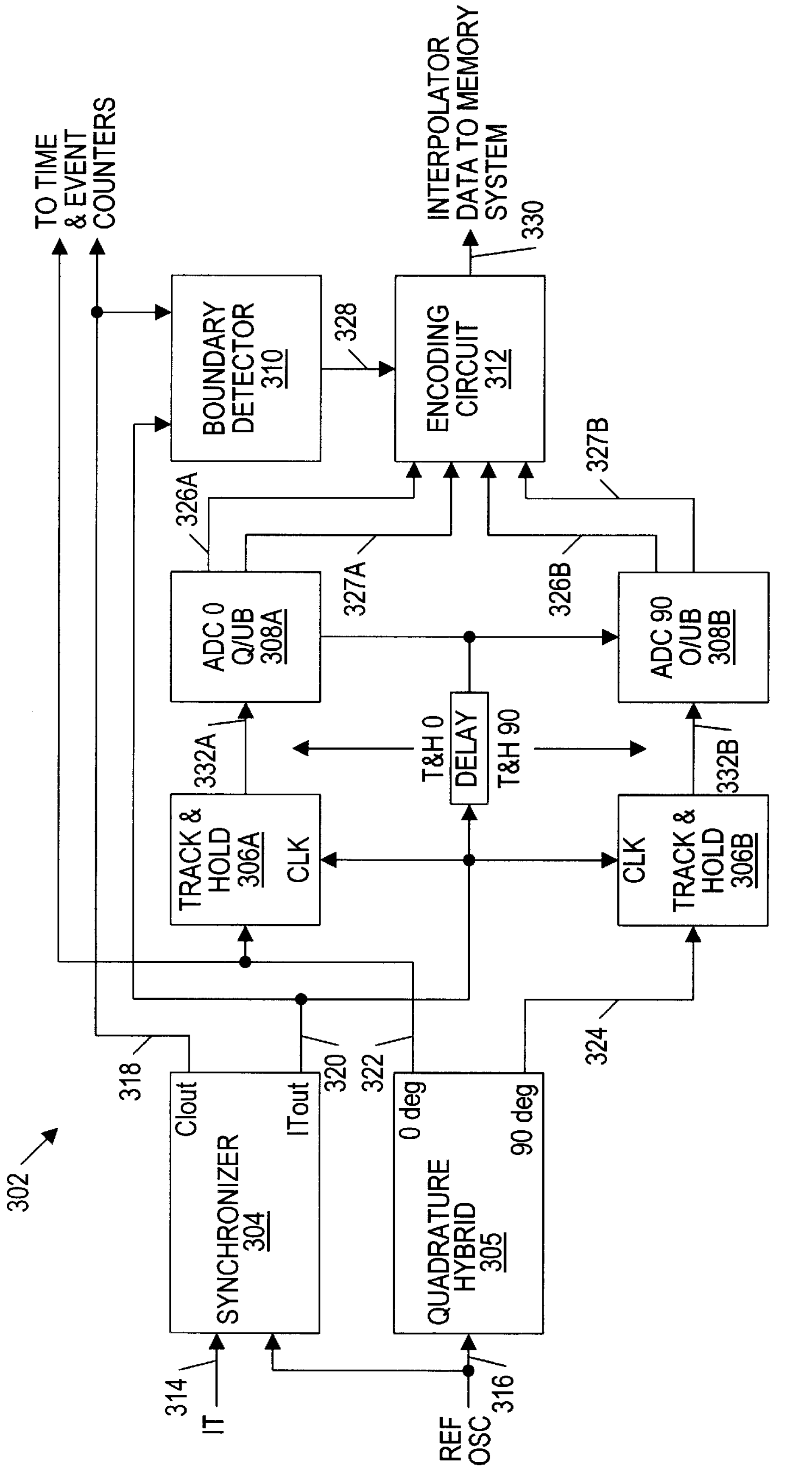
FIG. 1 (PRIOR ART)
FIG. 1 is a block diagram illustrating a prior art quadrature time-to-digital converter.
Figure 2:
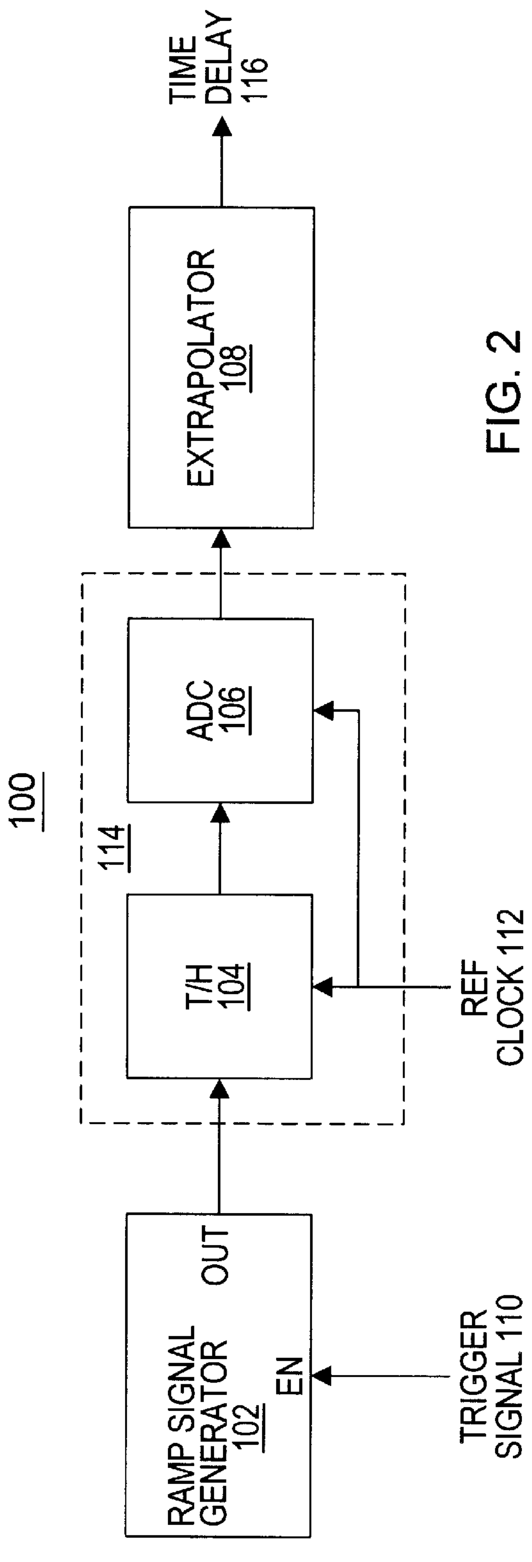
FIG. 2 is a block diagram of one embodiment of a time-to-digital converter using time stamp extrapolation according to the present invention.

Referring now to FIG. 2, a block diagram of one embodiment of a TDC using time stamp extrapolation is shown according to the present invention. It is noted that the embodiment of FIG. 2 is exemplary only, and the present invention may be implemented in various other embodiments, as desired. It is further noted that the embodiment of FIG. 2 is designed to accurately measure beyond the resolution of a reference clock. Accordingly, a number of clock cycles may be used to determine an approximate time of an event and a TDC according to the present invention may be used to more precisely measure the time an event occurs between clock cycles.

The TDC includes a ramp signal generator 102, a sampling device 114, an extrapolator 108, a trigger signal input 110, a reference clock input 112, and a time delay output 116. Sampling device 114 includes a track-and-hold 104 and an analog-to-digital converter (ADC) 106. Ramp signal generator 102 is coupled to receive trigger signal input 110 and provide an output to track-and-hold 104. Track-and-hold 104 is coupled to receive the output from ramp signal generator 102 and provide an output to ADC 106. Track-and-hold 104 and ADC 106 are each coupled to receive reference clock input 112. ADC 106 provides an output to extrapolator 108. Extrapolator 108 is coupled receive an output from ADC 106 and provide time delay output 116.

When ramp signal generator 102 receives a trigger signal on trigger signal input 110, ramp signal generator 102 starts a ramp signal. As used herein "ramp signal" is defined as a signal that starts at a known amplitude and increases at a substantially constant rate. A saw tooth wave is an example of a ramp signal. The ramp signal is coupled to sampling device 114, which samples the amplitude of the ramp signal.

Generally speaking, sampling device 114 samples an amplitude of an input signal. In a preferred embodiment, sampling device 114 includes track-and-hold 104 and ADC 106, which are both coupled to reference clock input 112. At two or more reference points, sampling device 114 detects the amplitude of the ramp signal. As used herein "reference point" refers to a known time at which a signal is sampled. In other embodiments, sampling device 114 may only include track-and-hold 104.

Track-and-hold 104 is coupled to the ramp signal and reference clock input 112. In one embodiment, the output of track-and-hold 104 tracks the ramp signal until an edge of a reference clock signal is received. When the edge of the reference clock signal is received, the output of track-and-hold 104 holds the amplitude of the ramp signal at the amplitude when the edge of the reference clock signal was received. During the time ADC 106 performs an analog-to-digital conversion on the hold signal, track-and-hold 104 prevents significant changes in the input to ADC 106.

ADC 106 is coupled to the output of track-and-hold 104 and to reference clock input 112. ADC 106 converts the analog amplitude of the ramp signal to a digital representation of the amplitude of the analog signal. In one embodiment, when a reference clock signal is received, track-and-hold 104 captures the ramp signal amplitude and holds that value substantially constant while ADC 106 converts the amplitude of the ramp signal to a digital value. In one embodiment, a delay element delays the receipt of the reference clock signal to the ADC. The delay ensures that the output of track-and-hold 104 is stable prior to the analog-to-digital conversion.

In one embodiment, sampling circuit 114 samples the amplitude of the ramp signal on the rising edge of the reference clock. It is apparent that sampling circuit 114 can be designed to sample the ramp signal amplitude at other times, such as the falling edge of the reference clock signal. In one particular embodiment, the amplitude of the ramp signal is sampled on the two rising edges of the reference clock subsequent to the trigger signal. In this embodiment, the ramp signal is enabled for at least three clock cycles. Because two samples are required, the ramp signal is enable for at least three clock cycles. As discussed above, ramp signal generator 102 starts the ramp signal when a trigger signal is received. On the first subsequent rising edge of the reference clock, sampling device 114 samples the amplitude of the ramp signal. On the second subsequent rising edge, sampling device 114 again samples the amplitude of the ramp signal. In other embodiments, sampling device 114 may sample the ramp signal additional times. In still other embodiments, the ramp signal generator may be sampled at different intervals. In the embodiment in which the ramp signal generator 102 is sampled on the two subsequent reference clock signals, ramp signal generator 102 is disabled after the two samples are taken. Ramp signal generator 102 restarts the ramp signal when a subsequent trigger signal is received, and the above process is repeated.

Extrapolator 108 receives the samples of the ramp signal from sampling device 114. Generally speaking, extrapolator 108 is a circuit that determines a time at which a signal started based on said two or more amplitude samples of the signal. From the initial amplitude of the ramp signal and the sampled amplitudes of the ramp signal at the known reference points, extrapolator 108 calculates the time at which the ramp signal was started. Because the ramp signal started when the trigger signal was received, extrapolator 108 calculates the time at which the trigger signal was received. In one embodiment, extrapolator 108 includes a storage device, or memory, for storing the sampled amplitudes of the ramp signal. In one embodiment, extrapolator 108 further includes a processor for calculating the time at which the trigger signal was received. A formula used to calculate the time at which the trigger signal was received is discussed below with reference to FIG. 4. It is noted that extrapolator 108 can be implemented in a variety of ways. For example, extrapolator 108 may be a digital signal processor, a digital central processing unit, digital logic or analog circuitry.

Figure 3:
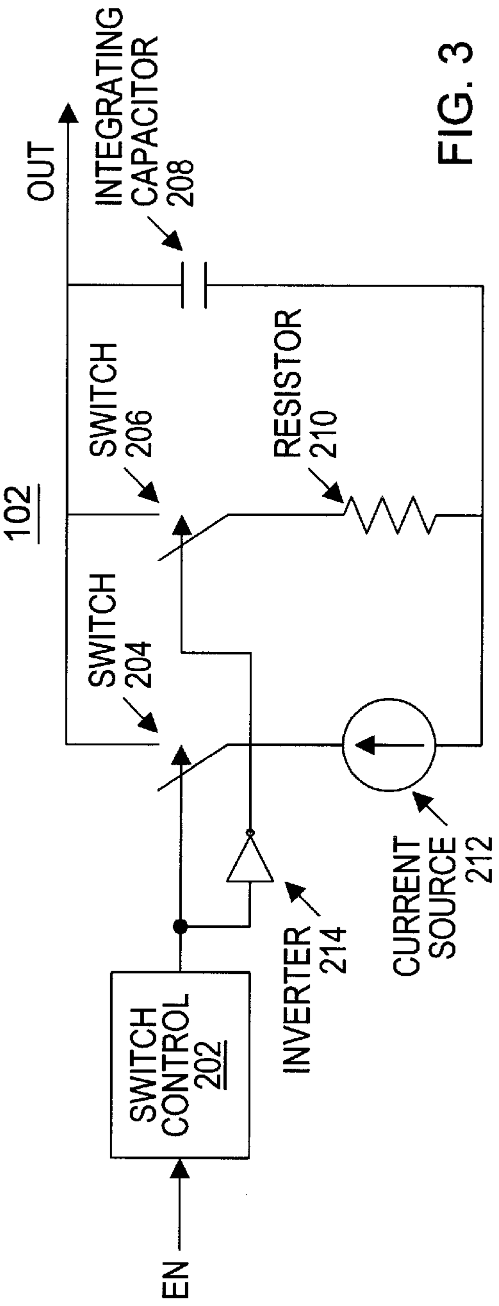
FIG. 3 is a block diagram of one embodiment of a ramp signal generator.

Turning now to FIG. 3, a block diagram of one embodiment of ramp signal generator 102 is shown. Ramp signal generator 102 includes a switch control 202, switches 204 and 206, an integrating capacitor 208, a resistor 210, a current source 212, and an inverter 214. Switch control 202 is coupled to an enable signal, switch 204, and inverter 214. The terminals of switch 204 are coupled to current source 212, switch 206, and integrating capacitor 208. The control of switch 204 is coupled to switch control 202. The terminals of switch 206 are coupled to switch 204, integrated capacitor 208, and resistor 210. The control of switch 206 is coupled to switch control 202 via inverter 214. Integrating capacitor 208 is coupled to switches 204 and 206, and resistor 210 and current source 212. Resistor 210 is coupled to switch 206, current source 212, and integrating capacitor 208. Current source 212 is coupled to switch 204, resistor 210, and integrating capacitor 208. Inverter 214 is coupled to switch control 202 and switch 206.

When the enable signal to switch control 202 is asserted, switch control 202 outputs a control signal that closes switch 204 and opens switch 206. When switch 204 is closed, current source 212 is coupled to integrating capacitor 208. As current source 212 charges integrating capacitor 208, the voltage across integrating capacitor 208 linearly increases. The slope of the voltage output of ramp signal generator 102, i.e., the ramp signal, is determined by current source 112 and the capacitive value of integrating capacitor 208.

When the enable signal to switch control 202 is deasserted, switch control 202 outputs a control signal that opens switch 204 and closes switch 206. When switch 204 is open, current source 212 no longer charges integrating capacitor 208. Switch 206 discharges integrating capacitor 208 through resistor 210. In one embodiment, the value of resistor 210 is chosen to quickly discharge integrating capacitor 208 relative to the charge time of integrating capacitor 208. In the illustrated embodiment, integrating capacitor 208 is discharged to substantially zero volts. Therefore, the output of ramp signal generator 102 drops to substantially zero volts. The output of ramp signal generator 102 remains at this voltage until the enable signal to switch control 202 is asserted.

It is apparent that other embodiments of ramp signal generator 102 may be employed. Any circuit that outputs a signal with a substantially constant slope will suffice. The above described embodiment is for illustrative purposes only. In an alternative embodiment, the signal generator outputs a non-constant slope signal, such as an exponential signal.

Figure 4:
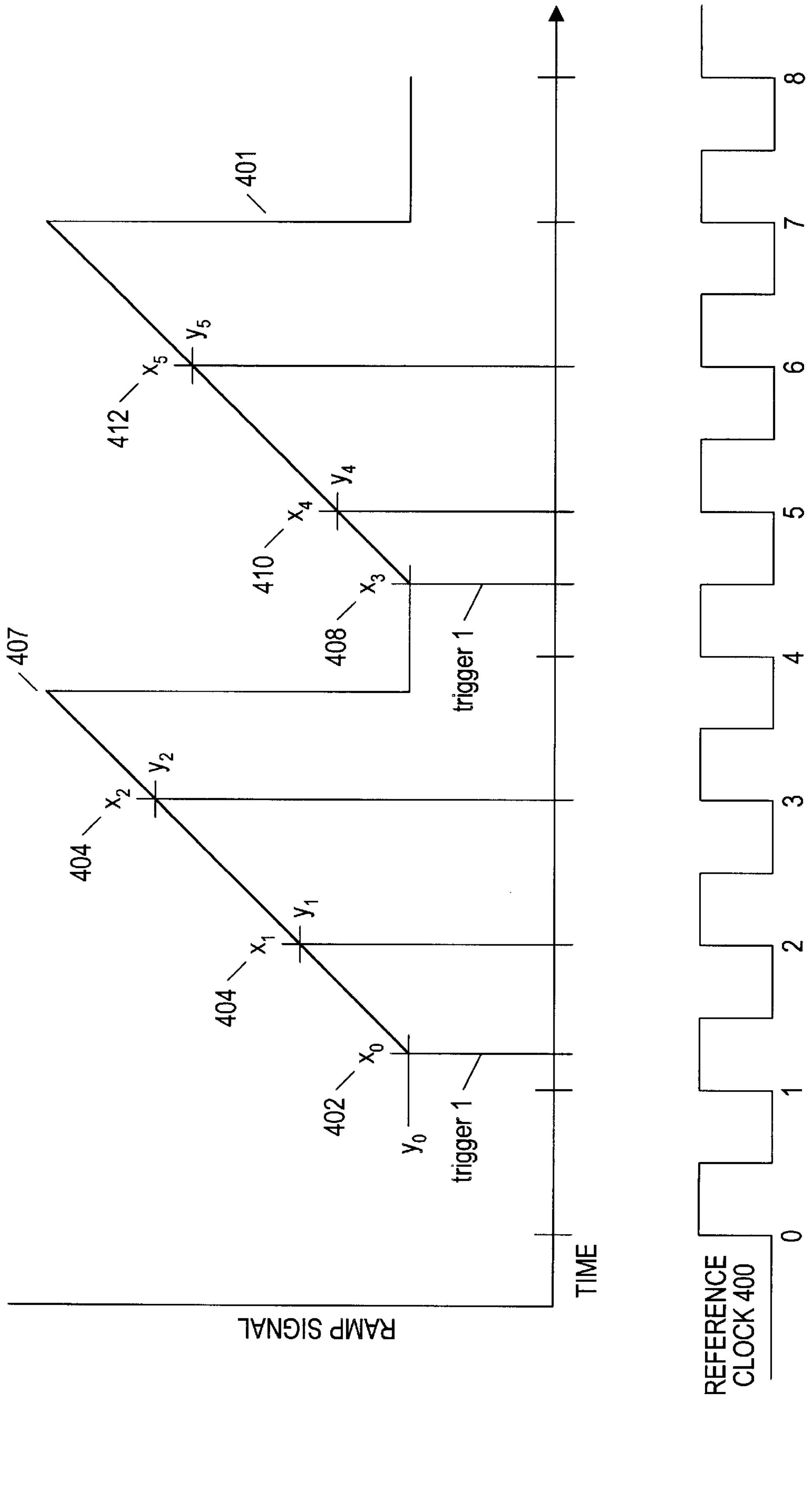
FIG. 4 is a timing diagram illustrating the operation of a time-to-digital converter using time stamp extrapolation.

FIG. 4 is a timing diagram illustrating the operation of a time-to-digital converter using time stamp extrapolation. Signal 400 represents the reference clock signal received on reference clock signal input 112 in FIG. 2. Signal 401 represents the ramp signal output of ramp signal generator 102. At point 402, a first trigger event occurs. As discussed above, a trigger signal on trigger signal input 110 is received by ramp signal generator 102 when a trigger event occurs. When ramp signal generator 102 receives the trigger signal, ramp signal generator 102 starts ramp signal 401. In the illustrated embodiment, the initial voltage, or amplitude, of ramp signal 401 prior to receipt of the trigger signal is y0. The first trigger event occurs at a time x0. The function of the TDC is to precisely determine the time, x0, at which the trigger event occurred. At point 404, the next rising edge of reference clock 400 occurs. In the illustrated embodiment, sampling device 114 samples the amplitude of ramp signal 401 on the rising edge of reference clock 400. In the illustrated embodiment, the rising edge of reference clock signal 400 occurs at time x1 and the amplitude of ramp signal 401 at time x1 is y1. At point 406, the next rising edge of reference clock 400 occurs. Sampling device 114 again samples ramp signal 401 on the rising edge of reference clock 400. This rising edge of reference clock 400 occurs at time x2 and the amplitude of ramp signal 401 at time x2 is y2.

At point 407, ramp signal generator 102 is disabled. When ramp signal generator 102 is disabled, ramp signal 401 returns to the initial voltage of y0. Point 407 occurs after sampling circuit 114 has obtained sufficient samples of ramp signal 401 to extrapolate the time x0.

At point 408, a second trigger event occurs. Ramp signal generator 102 starts ramp signal 401 on the occurrence of the trigger event. In the illustrated embodiment, the trigger event occurs at time x3. The initial amplitude of the ramp signal is y0. At point 410, a rising edge of reference clock 400 occurs. At point 410, sampling device 114 samples the amplitude of ramp signal 401. The amplitude of ramp signal 401 at time x4 is y4. At point 412, a subsequent rising edge of clock signal 400 occurs. Sampling device 114 samples the amplitude of ramp signal 401 at point 412 and obtains an amplitude y5.

The time at which the trigger events occurred can be calculated from the samples taken by sampling device 114. In one embodiment, the time x0 is calculated from the following information: the initial amplitude of ramp signal 401 (y0), the amplitude of ramp signal 401 at time x1 (y1), the amplitude of signal 401 at time x2 (y2), and the time interval between times x2 and x1. It is apparent that time x3 can be similarly calculated from the initial amplitude of ramp signal 401, the amplitude of ramp signal 401 at times x4 and x5, and the time interval between times x5 and x4.

In a preferred embodiment, the slope of ramp signal 401 is substantially constant. Because the slope of ramp signal 401 is substantially constant, the slope of ramp signal 401 from time x0 to x1 is equal to slope from time x1 to x2. Therefore, the following equation can be used to extrapolate the time of the trigger event (x0):

$$\frac{x_0 - x_1}{y_0 - y_1} = \frac{x_2 - x_1}{y_2 - y_1}$$

Because the equation is not dependent on the actual slope of ramp signal 401, the equation compensates for inaccuracies in the slope of ramp signal 401. Therefore inaccuracies in charge current or capacitance do not adversely effect the extrapolation calculation. Rearranging the equation and solving for x0 yields the following:

$$x_0 = x_1 + \left(\frac{x_2 - x_1}{y_2 - y_1}\right)(y_0 - y_1) \text{ or } x_0 = x_1 + \left(\frac{y_0 - y_1}{y_2 - y_1}\right)(x_2 - x_1)$$

The above equation will solve for x0 given any two amplitude samples taken at any known reference points. The equation can be simplified, however, if time is measured in terms of clock cycles and sample points occur at a one clock cycle interval. Measuring time in terms of clock cycles calculates time in terms of a number and a fraction of clock cycles. For example, if the clock period is 2 μs and the event occurs at 3 μs, then the time of the event in terms of clock cycles is 1.5 clock cycles. If amplitudes y2 and y1 are sampled one clock cycle apart and time is measured in terms of clock cycles, then x2−x1=1. Therefore, the following equation will calculate x0 in terms of clock cycles:

$$x_0 = x_1 + \left(\frac{y_0 - y_1}{y_2 - y_1}\right)$$

The equation can be further reduced if the initial amplitude of the ramp voltage is zero. In this case, the following equation will calculate x0:

$$x_0 = x_1 - \left(\frac{y_1}{y_2 - y_1}\right)$$

It is apparent that other formulas may be used to calculate x0 from the available sample points.

Figure 5:
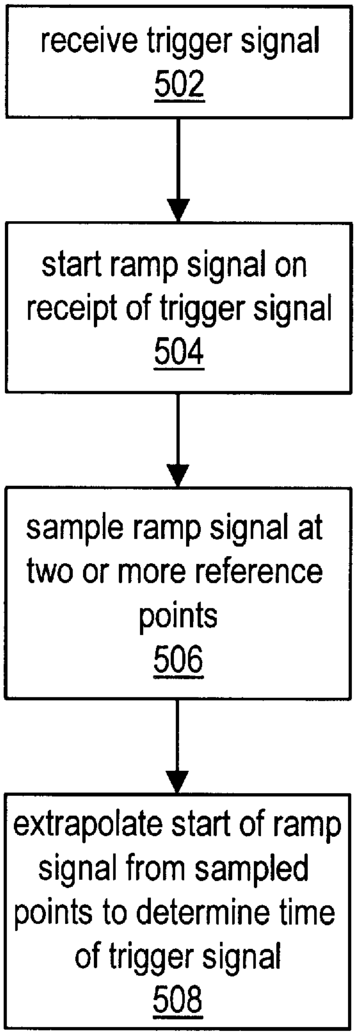
FIG. 5 is a flowchart of a method for measuring time using time stamp extrapolation according to the present invention.

FIG. 5 is a flowchart diagram illustrating the operation of one embodiment of a TDC using time stamp extrapolation. In a step 502, the TDC receives a trigger signal. As mentioned above, the function of the TDC is to accurately determine the time at which the trigger signal is received. In one embodiment, the TDC receives the trigger signal on a trigger signal line. In a step 504, a ramp signal is started on the receipt of the trigger signal. In one embodiment the ramp signal is a constant slope signal. In other embodiments, the ramp signal is any continuous signal. In a step 506, the ramp signal is sampled at two or more reference points. In a step 508, the time of the trigger signal is extrapolated from the sample points and the initial amplitude of the ramp signal.

As used herein, a signal is "asserted" if it conveys a value indicative of a particular condition. Conversely, a signal is "deasserted" if it conveys a value indicative of a lack of a particular condition. A signal may be defined to be asserted when it conveys a logical zero value or, conversely, when it conveys a logical one value.

Although the system and method of the present invention has been described in connection with a preferred embodiment, it is not intended to be limited to the specific form set forth herein, but on the contrary, it is intended to cover such alternatives, modifications, and equivalents, as can be reasonably included within the spirit and scope of the invention as defined by the appended claims.

What is claimed is:

1. A time-to-digital converter comprising:

a ramp signal generator that starts a ramp signal when a trigger signal is received;

a sampling device coupled to said ramp signal generator, wherein said sampling device samples an amplitude of said ramp signal at two or more reference points; and an extrapolator coupled to said sampling device, wherein said extrapolator determines a time at which said ramp signal was started based on said two or more amplitude samples of said ramp signal.

2. The time-to-digital converter of claim 1 wherein said two or more reference points are edges of a reference clock.

3. The time-to-digital converter of claim 1 wherein said sampling device includes a track-and-hold circuit coupled to said ramp signal generator, and an analog-to-digital converter coupled to said track-and-hold circuit.

4. The time-to-digital converter of claim 1 wherein said extrapolator extrapolates said time at which said ramp signal was started from an initial amplitude of said ramp signal and said amplitude samples of said ramp signal at said two or more reference points.

5. The time-to-digital converter of claim 4 wherein said extrapolator determines a slope of said ramp signal from said two or more reference points, and extrapolates said time at which said ramp signal was started using said slope.

6. The time-to-digital converter of claim 4 wherein said two or more reference points are edges of a reference clock.

7. The time-to-digital converter of claim 1 wherein said extrapolator includes a storage device for storing said amplitude samples of said ramp signal.

8. The time-to-digital converter of claim 7 wherein said extrapolator further includes a processor for determining said time at which said ramp signal was started based on said amplitude samples stored in said storage device.

9. The time-to-digital converter of claim 1 wherein said ramp signal is a linear signal.

10. The time-to-digital converter of claim 1 wherein said ramp signal generator comprises:

an integrating capacitor;

a switch coupled to said integrating capacitor and to said trigger signal, wherein said switch closes when said trigger signal is received; and a current source coupled to said switch, wherein said current source charges said integrating capacitor when said switch is closed.

11. A method of measuring a time that a trigger signal is received comprising:

receiving said trigger signal;

starting a ramp signal on receipt of said trigger signal;

sampling an amplitude of said ramp signal at two or more reference points after said starting of said ramp signal; and extrapolating a time at which said ramp signal was started from said sampled amplitudes of said ramp signal at said two or more reference points, wherein said extrapolating determines a time at which said trigger signal was received.

12. The method of measuring a time that a trigger signal is received of claim 11 wherein said two or more reference points are edges of a reference clock.

13. The method of measuring a time that a trigger signal is received of claim 11 wherein said step of sampling an amplitude of said ramp signal includes the steps of:

tracking-and-holding the ramp signal; and converting an amplitude of said ramp signal to a digital signal.

14. The method of measuring a time that a trigger signal is received of claim 11 further comprising the step of storing said sampled amplitudes of said ramp signal to a storage device.

15. The method of measuring a time that a trigger signal is received of claim 14 wherein a processor reads said sampled amplitudes from said storage device and performs said step of extrapolating said time at which said ramp signal was started.

16. The method of measuring a time that a trigger signal is received of claim 11 wherein said step of extrapolating a time that said ramp signal started includes:

determining a slope of said ramp signal from said sampled amplitudes of said ramp signals; and determining said time from said slope of said ramp signal, said amplitude of said first reference point, and a initial amplitude of said ramp signal.

17. A time measurement device comprising:

a trigger recognition circuit that outputs a trigger signal;

an input for receiving a reference clock signal; and a time-to-digital converter coupled to said trigger recognition circuit and said reference clock signal, wherein said time-to-digital converter includes:

a ramp signal generator that starts a ramp signal when a trigger signal is received;

an sampling device coupled to said ramp signal generator, wherein said sampling device samples an amplitude of said ramp signal at two or more reference points; and an extrapolator coupled to said sampling device, wherein said extrapolator determines a time at which said ramp signal was started based on said two or more amplitude samples of said ramp signal.

18. The time measurement device of claim 17 wherein said two or more reference points are edges of a reference clock.

19. The time measurement device of claim 17 wherein said sampling device includes a track-and-hold circuit coupled to said ramp signal generator, and an analog-to-digital converter coupled to said track-and-hold circuit.

20. The time measurement device of claim 17 wherein said extrapolator extrapolates said time at which said ramp signal was started from an initial amplitude of said ramp signal and said amplitude samples of said ramp signal at said two or more reference points.

21. The time measurement device of claim 20 wherein said extrapolator determines a slope of said ramp signal from said two or more reference points, and extrapolates said time at which said ramp signal was started using said slope.

22. The time measurement device of claim 20 wherein said two or more reference points are edges of a reference clock.

23. The time measurement device of claim 17 wherein said extrapolator includes a storage device for storing said amplitude samples of said ramp signal.

24. The time measurement device of claim 23 wherein said extrapolator further includes a processor for determining said time at which said ramp signal was started based on said amplitude samples stored in said storage device.

25. The time measurement device of claim 17 wherein said ramp signal is a linear signal.

* * * * *